United States Patent
Silvus et al.

(10) Patent No.: US 6,959,412 B2
(45) Date of Patent: Oct. 25, 2005

(54) ERROR CORRECTION CODING UTILIZING NUMERICAL BASE CONVERSION FOR MODULATION CODING

(75) Inventors: Gregory Lee Silvus, Boulder, CO (US); Kent Douglas Anderson, Broomfield, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 463 days.

(21) Appl. No.: 10/184,758

(22) Filed: Jun. 27, 2002

(65) Prior Publication Data

US 2005/0076285 A1 Apr. 7, 2005

Related U.S. Application Data (60) Provisional application No. 60/361,549, filed on Mar. 4, 2002.

(51) Int. Cl.⁷ .......................... H03M 13/31; H03M 13/05
(52) U.S. Cl. .......................... 714/778; 341/83; 714/752; 714/769
(58) Field of Search ................... 714/752, 769, 714/778; 341/83; H03M 13/05, 13/31

(56) References Cited

U.S. PATENT DOCUMENTS

| | | | |
|---|---|---|---|
| 3,602,704 A | * | 8/1971 | Akushsky et al. .......... 708/532 |
| 3,629,823 A | * | 12/1971 | Czernikowski ............. 714/746 |
| 3,944,973 A | | 3/1976 | Masson |
| 3,958,220 A | | 5/1976 | Marshall |
| 4,032,979 A | | 6/1977 | Rice |
| 4,107,650 A | | 8/1978 | Luke et al. |
| 4,202,018 A | | 5/1980 | Stockham, Jr. |
| 4,484,176 A | | 11/1984 | Fitzpatrick |
| 4,488,143 A | | 12/1984 | Martin |
| 5,136,436 A | | 8/1992 | Kahlman ...................... 360/40 |
| 5,260,703 A | | 11/1993 | Nguyen et al. ............. 341/100 |
| 5,311,521 A | | 5/1994 | Fitingof et al. |
| 5,475,388 A | | 12/1995 | Gormish et al. |
| 5,537,112 A | | 7/1996 | Tsang ........................... 341/59 |
| 5,635,933 A | | 6/1997 | Fitzpatrick et al. ........... 341/58 |
| 5,659,557 A | | 8/1997 | Glover et al. |
| 5,748,119 A | | 5/1998 | Ko ............................... 341/59 |
| 5,757,294 A | | 5/1998 | Fisher et al. .................. 341/57 |
| 5,757,822 A | | 5/1998 | Fisher et al. .................. 341/58 |
| 5,781,133 A | | 7/1998 | Tsang ........................... 341/59 |
| 5,784,010 A | | 7/1998 | Coker et al. .................. 341/61 |
| 5,812,603 A | * | 9/1998 | Luthi et al. ................. 714/752 |
| 6,002,718 A | | 12/1999 | Roth ........................... 375/240 |
| 6,018,304 A | | 1/2000 | Bessios ....................... 341/58 |
| 6,072,410 A | | 6/2000 | Kim ............................ 341/81 |
| 6,201,485 B1 | | 3/2001 | McEwen et al. |
| 6,236,340 B1 | * | 5/2001 | Patapoutian et al. .......... 341/58 |
| 6,259,384 B1 | | 7/2001 | McEwen et al. ............. 341/59 |
| 6,332,207 B1 | | 12/2001 | Southerland et al. ....... 714/763 |

FOREIGN PATENT DOCUMENTS

EP          0 566 330          10/1993

* cited by examiner

Primary Examiner—R. Stephen Dildine
(74) Attorney, Agent, or Firm—Shumaker & Sieffert P.A.

(57) ABSTRACT

A method of encoding data includes representing the data as number(s) in a first base. The method further includes converting the number(s) into a number(s) in a second base. The resultant number in the second base can be viewed as data suitable for encoding using an ECC algorithm. After being ECC encoded, the data may be further modulation encoded. Modulation encoding may include transforming each symbol to a value that constrains run lengths of a binary value (e.g., zero). A decoding method and system checks a received data block for erroneous symbols, maps each received, encoded symbol to an associated ECC-encoded transform pair. The ECC encoded data may be decoded and corrected using the ECC and the locations of identified erroneous symbols. Finally, the corrected data sequence is converted from the second base back to the first base, from which the original data is retrieved.

35 Claims, 9 Drawing Sheets

| Non-run-length limited symbol | Run-length limited symbol |
|---|---|
| 0 | $2^s - p^\alpha$ |
| 1 | $2^s - p^\alpha + 1$ |
| 2 | $2^s - p^\alpha + 2$ |
| ... | ... |
| $p^\alpha - 2$ | $2^s - 2$ |
| $p^\alpha - 1$ | $2^s - 1$ |

ERROR CORRECTION CODING UTILIZING NUMERICAL BASE CONVERSION FOR MODULATION CODING

RELATED APPLICATIONS

This application claims priority of U.S. provisional application Ser. No. 60/361,549, filed Mar. 4, 2002.

FIELD OF THE INVENTION

This application relates generally to data communication and/or storage, more particularly to error correction coding and modulation coding, and more specifically to error correction coding using numerical base conversion.

BACKGROUND OF THE INVENTION

In the fields of data storage and communication, data reliability is critical. Specifically, it is important that data transmitted or stored is substantially free from errors when that data is received or retrieved from storage, respectively. Traditional methods for ensuring data reliability have included appending check bits or parity symbols onto data prior to transmission or storage whereby upon receipt of the data, the parity symbols may be used to detect and correct errors in the data. A symbol is generally a unit of data, and typically includes a number of bit. Essentially, the parity symbols add redundancy to data, which is transmitted via and/or stored on a potentially noisy medium. One broad class of redundancy error correction techniques is error correction coding (ECC). One class of commonly used ECC algorithms is the Reed-Solomon (RS) class of algorithms.

Another coding technique called modulation coding is typically used after data is encoded with ECC. The term "modulation coding" refers generally to encoding a data stream to meet a modulation constraint, one or more properties which may be useful or necessary for transmission or storage of data through a communication or data storage channel. One particular example of modulation coding is run-length limited (RLL) coding. RLL coding also adds redundancy, and the redundancy is most often used to guarantee that timing information is present in the data stream when the data stream is received (in the case of data transmission) or retrieved (in the case of data storage). A data stream includes a series of pulses, often electrical voltage pulses, and the presence of a pulse at a particular bit time corresponds to the presence of a binary one in the RLL coded data stream. RLL coding provides timing recoverability by encoding the data stream such that the number of consecutive binary zeros in the data stream is limited to a desired maximum number, or k-constraint. The k-constraint ensures that the space between pulses is not too long, and thereby provides timing recoverability because the space between pulses does not carry any timing information. Many variations of RLL codes exist that provide a wide range of k-constraints. In current approaches, a data stream is ECC coded prior to RLL coding. Several problems have been identified with practicing ECC coding with traditional RLL coding.

RLL coding and ECC reduce code rate. Code rate refers to the relationship between a number of input data bits prior to encoding, and the number of data bits after encoding. The overall code rate is the product of the RLL code rate and the ECC code rate. The RLL and ECC code rates are less than one because RLL coding and ECC add extra bits to the input data in order to provide timing recovery and data reliability when data is received or retrieved. These extra bits are necessary because timing recovery and the ability to correct errors require additional redundancy. The code rate is a measure of the redundancy introduced into the data. In general, more timing recovery information and error correction information results in a penalty of decreased code rate. Conversely, as the code rate increases, the robustness of the timing information and the ECC decreases. In other words, as more parity symbols are added to input data during encoding, higher reliability can be achieved. However, as higher reliability is achieved by adding parity symbols, the code rate goes down. In general, a lower code rate adversely impacts design parameters, including storage density requirements (in the case of data storage) and bandwidth requirements (in the case of data transmission).

One problem that has been recognized with respect to RLL coding is error propagation. Error propagation refers to an effect in which errors introduced to data in a data block may be spread to other parts of the data block after RLL decoding. Error propagation due to RLL decoding can drastically reduce data reliability because data errors grow in size (propagate) through RLL decoding and thereby may corrupt multiple ECC code symbols, often rendering them useless in recovering data.

One approach that has been used to limit the effects of error propagation is referred to as reverse ECC. As discussed earlier, a common approach is introducing the ECC code prior to the RLL code. Reverse ECC involves RLL encoding of input data prior to ECC coding. In other words, input data is RLL encoded and subsequently ECC encoded. Since ECC coding adds extra bits, i.e., the parity symbols, reverse ECC requires another step, whereby ECC parity symbols are separately RLL encoded, because the parity symbols may otherwise violate the specified run-length constraint for binary zeros. Although the Reverse ECC approach may limit error propagation to a certain degree, problems with Reverse ECC have been identified. First, implementation of Reverse ECC has resulted in greater die size requirements in integrated circuits. Additionally, for a given degree of data reliability, code rate may be reduced because the second RLL encoding increases the block redundancy beyond the amount required for standard (i.e., not reverse) RLL and ECC implementation.

It is with respect to these and other considerations that the present invention has been developed.

SUMMARY OF THE INVENTION

Against this backdrop, embodiments of the present invention have been developed.

One embodiment includes a method of communicating data by representing data in a first base representation, converting the representation of the data in the first base to a representation of the data in a second base, error correction encoding the representation of data in the second base, and transforming coefficients of the error correction encoded data in the second base to limit the number of consecutive zeroes in the encoded representation. The method may further include communicating the transformed encoded data via a medium, such as a data storage disc or a communication channel and receiving or retrieving the transformed data. Furthermore, the method may include inverse-transforming the received transformed data, correcting errors that may have occurred in the encoded data in the second base, error correction decoding or removal of the added parity symbols in the second base, and converting the data back to the representation in the first base. Transforming the data may involve mapping coefficients in the error correction encoded data in the second base to symbols in a set of values, which are selected to meet a specified modulation constraint.

In one embodiment, the set of values used for mapping may include a lower limit defined by the difference between the first base and the second base and an upper limit defined by the first base minus 1. Mapping the coefficients to values in the set may be performed by adding the difference between the first base and the second base to coefficients of the error correction encoded data. In another embodiment, transforming the data may include altering the range of the coefficients in the second base such that the error correction encoded representation of the data has a k-constraint (i.e., maximum number of consecutive zeros). Still further, transforming the data may include mapping each of the coefficients of the error correction encoded representation to a unique element of the set of values to ensure a predetermined k-constraint. Further still, the data may be transformed to remove undesirable patterns in addition to or other than consecutive zeros.

Yet another embodiment includes a system for communicating data having an encoder with a downward base converter module that receives input data and converts the input data from a first base to a second base, wherein the second base is less than the first base. The system may further include a communicating module operable to communicate the data in the second base via or to a medium. Still further, the system may include a receiving or retrieving module that receives or retrieves the data from the medium, and a decoder having an upward base converter module that converts the retrieved data from the second base back into the first base representation. The encoder may further include an error correction code (ECC) encoding module that encodes the input data, and a coefficient transformation module that maps encoded symbols in the second base to symbols in a set of symbols selected to provide a desired property or properties that are useful or necessary for transmission or storage through a communication or data storage channel.

In yet another embodiment of the system, the coefficient transformation module adds a value 'r' to each of the symbols in the input data, wherein the value 'r' is equal to or less than $(2^s - p^\alpha)$ and greater than zero, and wherein s is a number of bits per symbol in the input data, $2^s$ is the first base, and $p^\alpha$ is the second base and p is a prime number, and s and $\alpha$ are positive integers. The decoder may further include an erasure-check module that identifies symbols having errors in the received or retrieved data. The decoder may further include a coefficient transformation module that subtracts the value 'r' from each symbol in the retrieved data.

These and various other features as well as advantages which characterize the present invention will be apparent from a reading of the following detailed description and a review of the associated drawings.

DETAILED DESCRIPTION

Embodiments of the present invention are described with reference to a series of figures. Generally, embodiments of the present invention relate to systems and methods incorporated in a computing device for encoding and/or decoding data. More particularly, the systems and methods change a numerical base representation of data prior to encoding. More particularly still, the representation of data is changed by representing the data in a different base than the original representation. Still more particularly, the systems and methods shift the range of data coefficients to a range whereby a desired k-constraint is ensured. More particularly still, the systems and methods achieve data reliability by incorporating erasure data to decode the encoded data.

Figure 1:
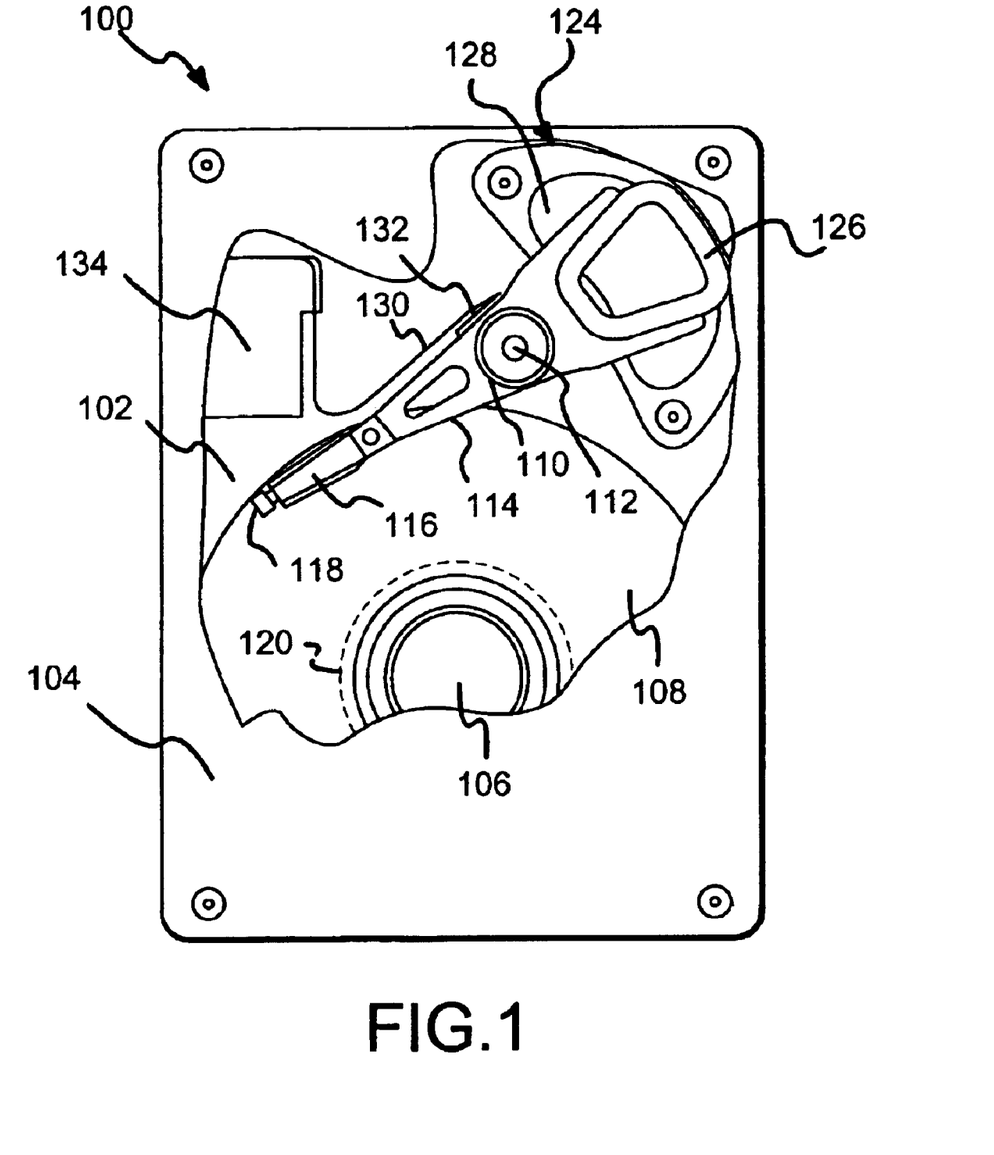
FIG. 1 is a plan view of a disc drive incorporating a preferred embodiment of the present invention showing the disc drive's primary internal components.

A disc drive 100 constructed in accordance with a preferred embodiment of the present invention is shown in FIG. 1. The disc drive 100 includes a baseplate 102 to which various components of the disc drive 100 are mounted. A top cover 104, shown partially cut away, cooperates with the baseplate 102 to form an internal, sealed environment for the disc drive in a conventional manner. The components include a spindle motor 106, which rotates one or more discs 108 at a constant high speed. Information is written to and read from tracks on the discs 108 through the use of an actuator assembly 110, which rotates during a seek operation about a bearing shaft assembly 112 positioned adjacent the discs 108. The actuator assembly 110 includes a plurality of actuator arms 114 which extend towards the discs 108, with one or more flexures 116 extending from each of the actuator arms 114. Mounted at the distal end of each of the flexures 116 is a head 118, which includes an air bearing slider enabling the head 118 to fly in close proximity above the corresponding surface of the associated disc 108.

During a seek operation, the track position of the heads 118 is controlled through the use of a voice coil motor (VCM) 124, which typically includes a coil 126 attached to the actuator assembly 110, as well as one or more permanent magnets 128 which establish a magnetic field in which the coil 126 is immersed. The controlled application of current to the coil 126 causes magnetic interaction between the permanent magnets 128 and the coil 126 so that the coil 126 moves in accordance with the well-known Lorentz relationship. As the coil 126 moves, the actuator assembly 110 pivots about the bearing shaft assembly 112, and the heads 118 are caused to move across the surfaces of the discs 108.

The spindle motor 106 is typically de-energized when the disc drive 100 is not in use for extended periods of time. The heads 118 are moved over park zones 120 near the inner diameter of the discs 108 when the drive motor is de-energized. The heads 118 are secured over the park zones 120 through the use of an actuator latch arrangement, which prevents inadvertent rotation of the actuator assembly 110 when the heads are parked.

A flex assembly 130 provides the requisite electrical connection paths for the actuator assembly 110 while allowing pivotal movement of the actuator assembly 110 during operation. The flex assembly includes a printed circuit board 132 to which head wires (not shown) are connected; the head wires being routed along the actuator arms 114 and the flexures 116 to the heads 118. The printed circuit board 132 typically includes circuitry for controlling the write currents applied to the heads 118 during a write operation and a preamplifier for amplifying read signals generated by the heads 118 during a read operation. The flex assembly terminates at a flex bracket 134 for communication through the baseplate 102 to a disc drive printed circuit board (not shown) mounted to the bottom side of the disc drive 100.

In the embodiment shown in FIG. 1, the write head 118 in combination with current-controlling circuitry may generally be referred to as a communication module for communicating data onto the disc 108. The read head 118 in combination with the preamplifier may be referred to as a retrieving module, whereby data is retrieved from the disc 108. In general, a communication module includes any hardware, software, and/or firmware operable to communicate data via or to a medium. Likewise, in general, a retrieving module includes any hardware, software, and/or firmware operable to receive data from the medium. While embodiments described herein are directed at use in a disc drive, it is to be understood that other types of mediums, such as communications channels, and devices, such as transmitters and receivers, may advantageously employ embodiments of the present invention.

Figure 2:
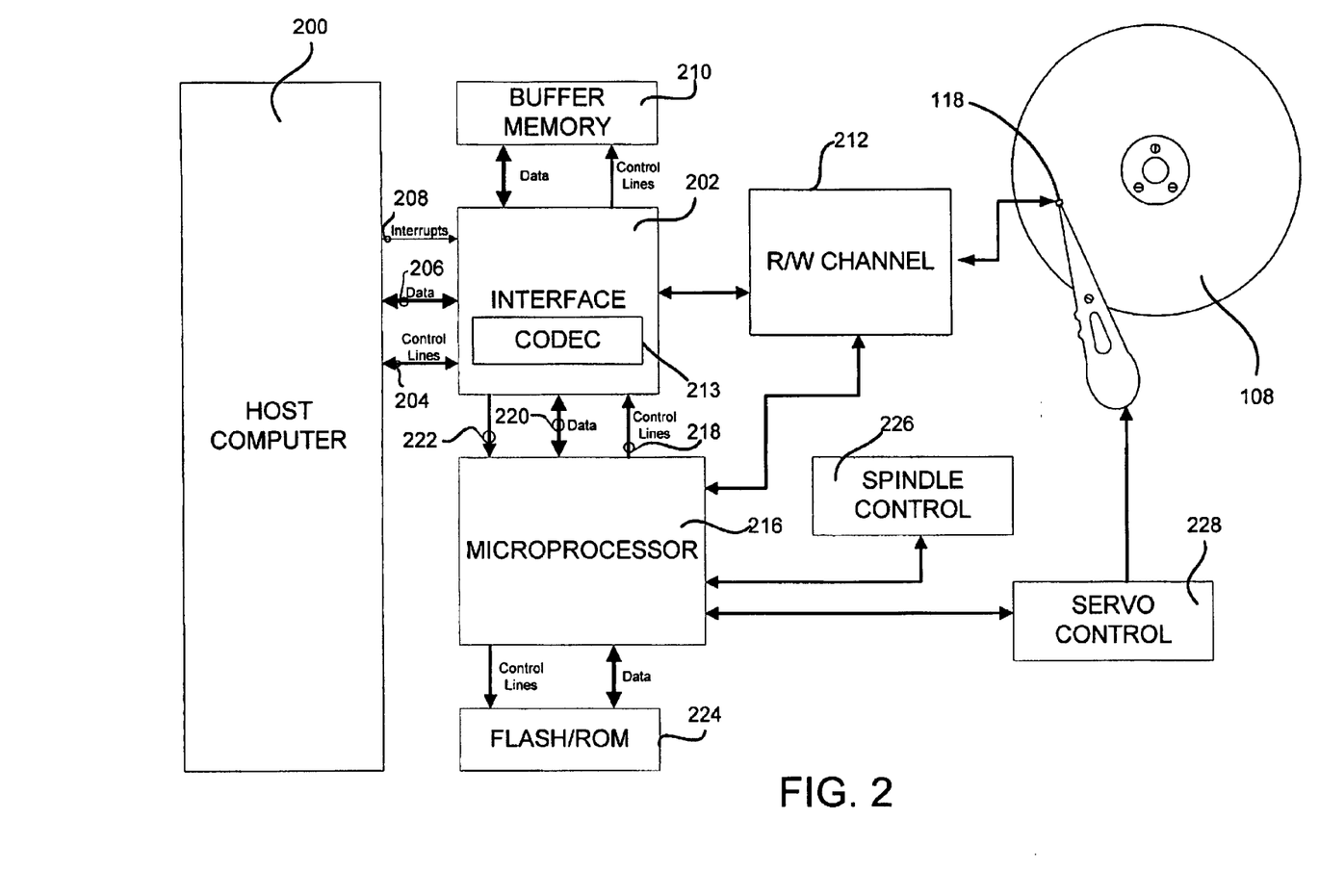
FIG. 2 is a functional block diagram of the disc drive of FIG. 1 in accordance with a preferred embodiment of the present invention.

Referring now to FIG. 2, shown therein is a functional block diagram of the disc drive 100 of FIG. 1, generally showing the main functional circuits which are typically resident on a disc drive printed circuit board and which are used to control the operation of the disc drive 100. As shown in FIG. 2, the host 200 is operably connected to an interface application specific integrated circuit (interface) 202 via control lines 204, data lines 206, and interrupt lines 208. The interface 202 typically includes an associated buffer 210, which facilitates high-speed data transfer between the host 200 and the disc drive 100. Data to be written to the disc drive 100 are passed from the host to the interface 202 and then to a read/write channel 212, which encodes and serializes the data.

In an embodiment, the interface 202 includes a coder/decoder (CODEC) 213 for encoding and decoding data. The CODEC 213 employs unique systems and methods for ensuring data reliability and timing recovery for a given code rate. Embodiments of the CODEC 213 are described in more detail below with reference to functional block diagrams and operation flow diagrams.

The read/write channel 212 also provides the requisite write current signals to the heads 118 via the write current controlling circuitry on printed circuit board 132. To retrieve data that has been previously stored by the disc drive 100, read signals are generated by the heads 118 and provided, via the preamplifier on printed circuit board 132, to the read/write channel 212, which processes and outputs the retrieved data to the interface 202 for subsequent transfer to the host 200. Such operations of the disc drive 100 are well known in the art and are discussed, for example, in U.S. Pat. No. 5,276,662 issued Jan. 4, 1994 to Shaver et al.

As also shown in FIG. 2, a microprocessor 216 is operably connected to the interface 202 via control lines 218, data lines 220, and interrupt lines 222. The microprocessor 216 provides top level communication and control for the disc drive 100 in conjunction with programming for the microprocessor 216 which is typically stored in a microprocessor memory (MEM) 224. The MEM 224 can include random access memory (RAM), read only memory (ROM) and other sources of resident memory for the microprocessor 216. Additionally, the microprocessor 216 provides control signals for spindle control 226, and servo control 228.

Figure 3:
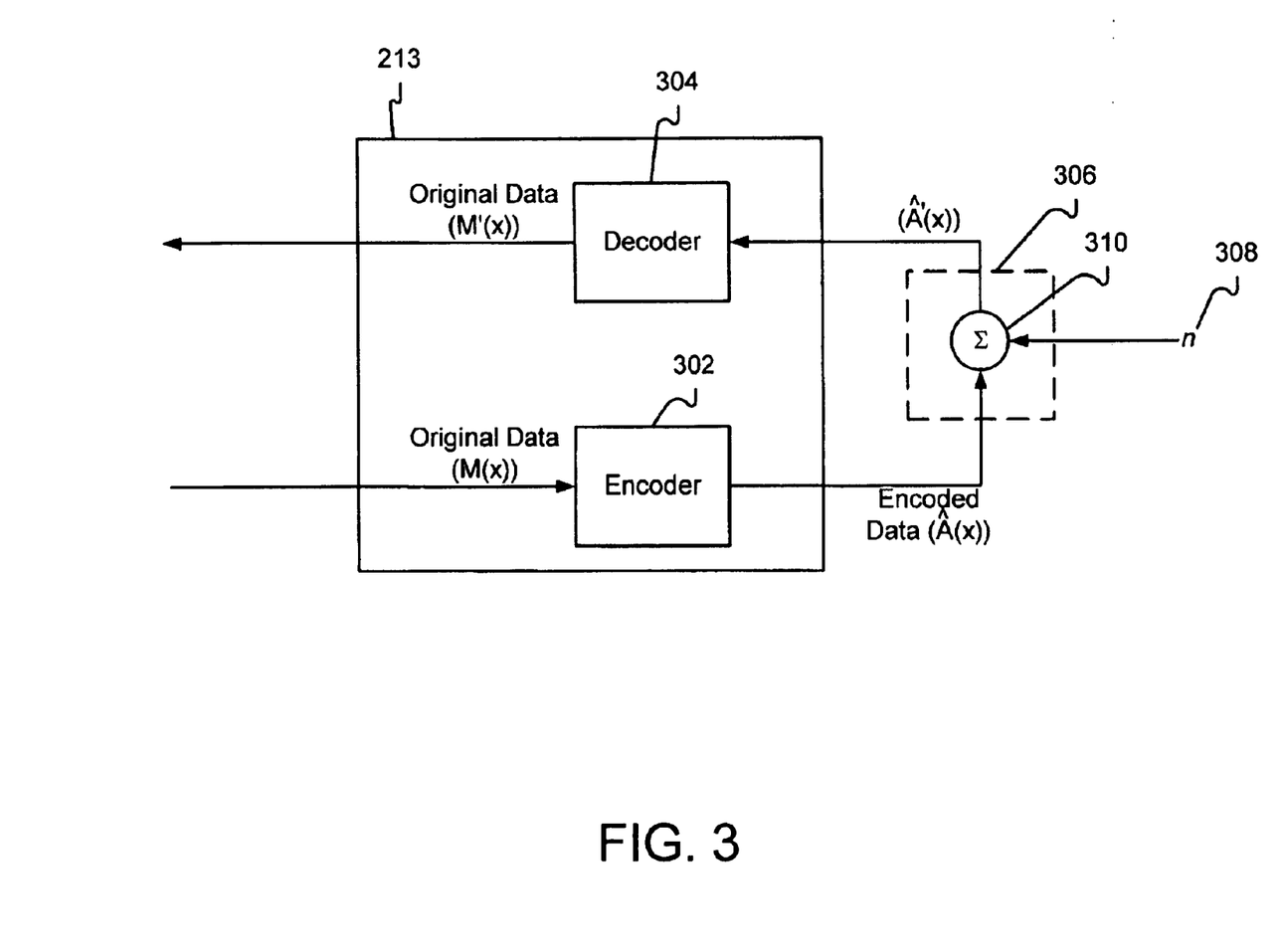
FIG. 3 is a module diagram illustrating functional modules of a CODEC as in FIG. 2 in an exemplary embodiment of the present invention.

One embodiment of the CODEC 213 (FIG. 2) is illustrated in FIG. 3 in combination with a communication or storage medium. In this particular embodiment, the CODEC 213 includes an encoder 302, and a decoder 304, which encode and decode data respectively. The encoder 302 receives input data, M(x), and outputs encoded data, Â(x). The encoded data, Â(x), is communicated via a noisy medium 306 (e.g., the disc 108 of FIG. 1). The noisy medium may be any communication channel or storage medium wherein the encoded data experiences noise or any disturbance that may impart errors in the encoded data, Â(x). Noise as used herein refers to any phenomenon, random or deterministic, associated with the medium 306 that tends to cause information (e.g., bits) in the encoded data to change. As illustrated, the medium306 imparts noise 308 upon the encoded data, Â(x). In the particular embodiment in FIG. 3, the medium 306 is abstracted as including an addition function 310, whereby the noise 308 is added to the encoded data, Â(x). It is to be understood, however, that in general, noise can have other effects upon Â(x) besides, or in combination with, additive effects.

With regard to the noisy medium 306, an example of a noisy medium is exhibited as part of a disc drive in FIG. 2. Noise may be imparted on data in the disc drive 100 at any point along the data path. By way of example, and not limitation, the noisy medium 306 in the disc drive 100 may include the disc 108 shown in FIG. 2. After data is written to the disc 108, disturbances in the disc drive 100 may cause errors to arise in the data stored on the disc 108. The noisy medium 306 may further include the read/write channel 212 and the read/write head 118. Thus, noise may be imparted upon data when the data is in the read/write channel 212 before or after the data is written to the disc 108.

With regard to the decoder 304, the decoder 304 receives the communicated encoded data Â'(x) from the channel as it may have been changed by the medium. The decoder 304 uses encoding data that was included by the encoder 302, to determine the original data M(x) from the encoded data, Â'(x). The output of the decoder 304 is M'(x), which may differ from M(x) if uncorrectable errors were imparted on Â (x) as it was transferred over the medium 306. The decoder 304 is designed to be able to correct up to a specified number of errors; however, if more errors occur than the specified number, then the decoder 304 is not able to derive M(x), but rather M'(x). In one embodiment, the decoder 304 performs operations substantially in reverse of the operation performed by the encoder 302. In another embodiment, discussed below, the decoder 304 includes additional decoding operations to identify erasure data that may become available in Â'(x) due to unique attributes of the encoding process.

Figure 4:
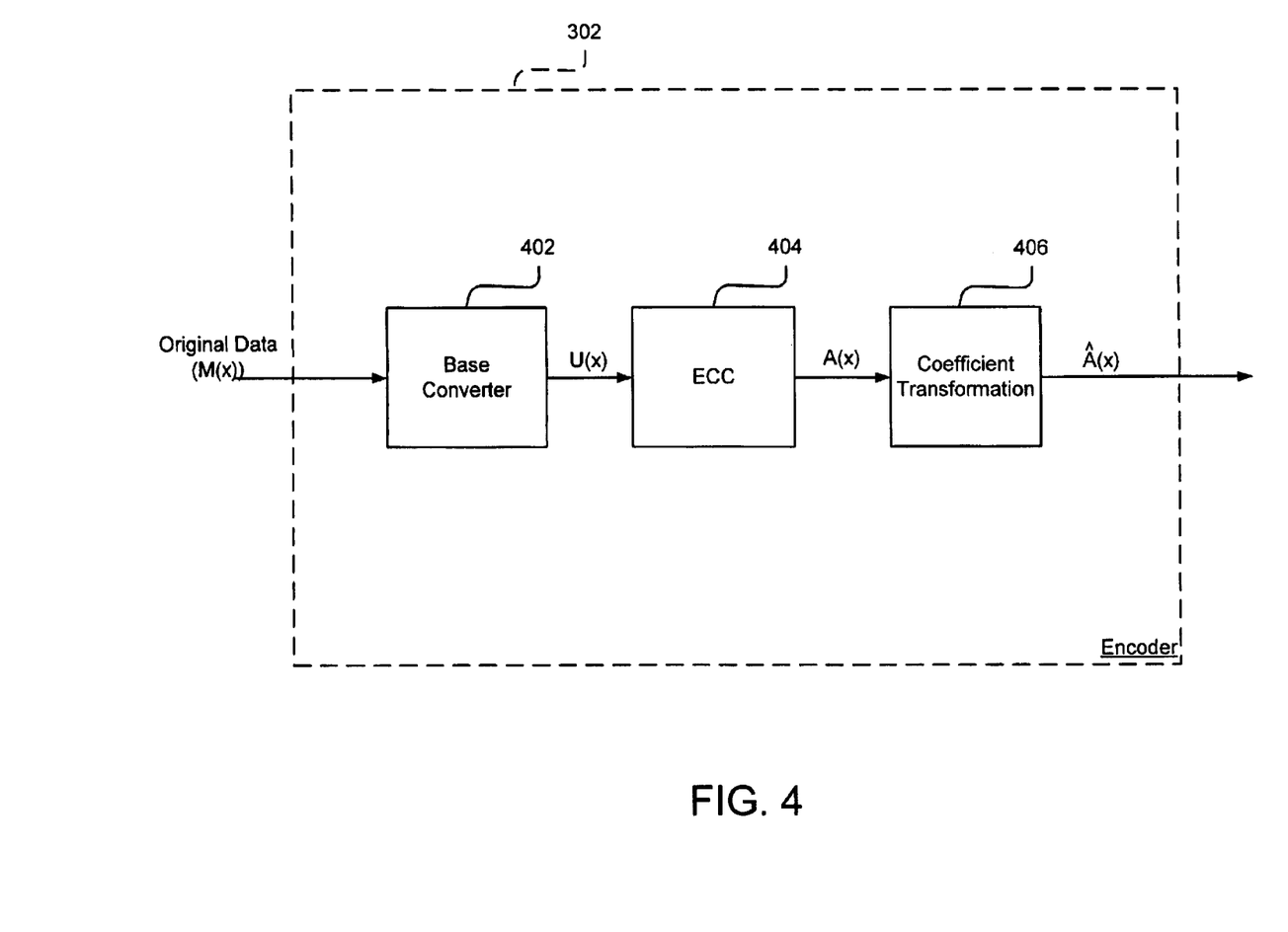
FIG. 4 is a module diagram illustrating functional modules of an encoder as in FIG. 3 in accordance with an embodiment of the present invention.

A particular embodiment of the encoder 302 is illustrated in FIG. 4. The encoder 302 includes a downward base converter 402, an ECC encoder 404, and a coefficient transformation module 406. In general, the functional modules of the encoder 302 may be designed to ensure data reliability for a given desired code rate, and a desired modulation constraint, such as a k-constraint. As discussed herein, the k-constraint refers to a measure of a maximum number of consecutive binary zeros in the encoded data.

An input data block, M(x), is received by the downward base converter 402, which converts M(x) from one numerical base representation into another numerical base representation. In this embodiment, M(x) may be represented in a polynomial form as shown in equation (1) below.

$$M(x) = \mu_{m-1}x^{m-1} + \mu_{m-2}x^{m-2} + \ldots + \mu_2 x^2 + \mu_1 x^1 + \mu_0 \quad (1)$$

In general, M(x) is a series of symbols represented by the coefficients, $\mu_i$. Each coefficient, $\mu_i$ represents the $i^{th}$ symbol in M(x), and x is a variable that holds the place of each coefficient, $\mu_i$, according to the order of the symbols in the data block.

In one embodiment, M(x) may be viewed as a number, or multiple numbers in a numerical base, such as $2^s$, where s is the number of bits/symbol in M(x). For illustrative purposes only, in typical storage devices, s is equal to 8 bits/symbol or 10 bits/symbol; however, s may be any value suitable to the particular implementation. By substituting the value $2^s$ for x, M(x) may be viewed as a series of digits, $\mu_i$. Thus, M(x) may be viewed as shown in equation (2):

$$M(x) = M(2^s) = \{\mu_{m-1}\mu_{m-2} \ldots \mu_2\mu_1\mu_0\} \quad (2)$$

As such, $M(2^s)$ is an m-digit number in base $2^s$.

A symbol refers to a sequence of s digits (e.g., bits) represented as an element of a Galois Field (GF), often a Galois Field with $2^s$ elements expressed as $GF(2^s)$. Advantageously, when using Reed Solomon (RS) ECC, a data stream such as M(x), may be represented as any Galois Field, $GF(p^\alpha)$, wherein p is a prime number, $p^\alpha$ is less than $2^s$, and $\alpha$ is any positive integer. The downward base converter 402 takes advantage of this characteristic of Galois Fields and ECC algorithms (such as Reed-Solomon algorithms) that are based on Galois Fields, by converting the input data block, M(x), from an initial base representation (e.g., in base $2^s$) into another base representation (e.g., in base $p^\alpha$) to facilitate encoding M(x) for a given code rate, reliability, or other specified modulation constraint, such as a k-constraint.

The downward base converter 402 converts data block $M(2^s)$ from base $2^s$ into a data block U(x) represented in numerical base $p^\alpha$, where $p^\alpha$ is less than $2^s$. Thus, the output of the downward base converter 402 is a data block $U(p^\alpha)$, in base $p^\alpha$. $U(p^\alpha)$ may be viewed as a polynomial with coefficients $\upsilon_i$ as shown in the polynomial equation (3).

$$U(x) = \upsilon_{u-1}x^{u-1} + \upsilon_{u-2}x^{u-2} + \ldots + \upsilon_2 x^2 + \upsilon_1 x^1 + \upsilon_0 \quad (3)$$

$U(p^\alpha)$ may also be represented as a series of u digits or symbols wherein each symbol is a coefficient, $\upsilon_i$, as illustrated in equation (4):

$$U(p^\alpha) = M(2^s) = \{\upsilon_{u-1}\upsilon_{u-2} \ldots \upsilon_2\upsilon_1\upsilon_0\} \quad (4)$$

A symbol in $U(p^\alpha)$ refers to a sequence of a digits in base p representing an element of a Galois Field with $p^\alpha$ elements, expressed as $GF(p^\alpha)$. $U(p^\alpha)$ can also be considered a u-digit base-$p^\alpha$ number.

U(x) is input into the ECC encoder 404 for ECC encoding. The ECC encoder calculates ECC codes and appends two or more ECC code, or parity, symbols onto the data block U(x). Any ECC method based on $GF(p^\alpha)$ coefficients as may be known in the art may be used by the encoder 404 to encode the data stream U(x), including non-systematic ECC codes which alter the input symbols U(x) and integrate the ECC code (parity) symbols into the alteration. The output of the ECC encoder is an encoded data block Â(x). For example, the ECC encoder 404 may employ a Reed-Solomon (RS) encoding algorithm. In a particular embodiment, the ECC encoder 404 employs the transformation presented in equation (5) shown below:

$$A(x) = x^{v-u}U(x) - (x^{v-u}U(x)) \bmod h(x), \quad (5)$$

where U(x) is the message block with coefficients from base $p^\alpha$, A(x) is a new ECC-coded data block, v is the number of symbols in A(x), u is the number of symbols in the message block in base $p^\alpha$, and h(x) is a generator polynomial in $GF(p^\alpha)$.

The encoded data A(x), is input into the coefficient transformation module 406. The coefficient transformation module 406 transforms each coefficient of A(x) such that each coefficient is mapped to a value in a predetermined set of values chosen to satisfy a modulation constraint such as a k-constraint. This predetermined set of values may be a contiguous range of values related to the base $2^\alpha$ and the base $p^\alpha$. In one embodiment of the coefficient transformation module 406, a value, 'r', is added onto each coefficient of A(x) to yield a transformed data block, Â(x), wherein 'r' is given by equation (6):

$$r = 2^s - p^\alpha \quad (6)$$

In this particular embodiment, the value represents the difference between the original base and the new base. In an alternative embodiment, 'r' can take on any value in a range defined by $\{1, 2^s - p^\alpha\}$, inclusively. As is readily recognized, by adding 'r' to each coefficient in A(x), a non-zero value is ensured for each coefficient of Â(x). More specifically, if 'r' is added to each coefficient, a k-constraint is ensured in accordance with equation (7) shown below:

$$k = 2s - 2 - \text{floor}[\log_2(r)] \quad (7)$$

By judicious choice of the transformation, a suitable k-constraint may be selected.

Figure 5:
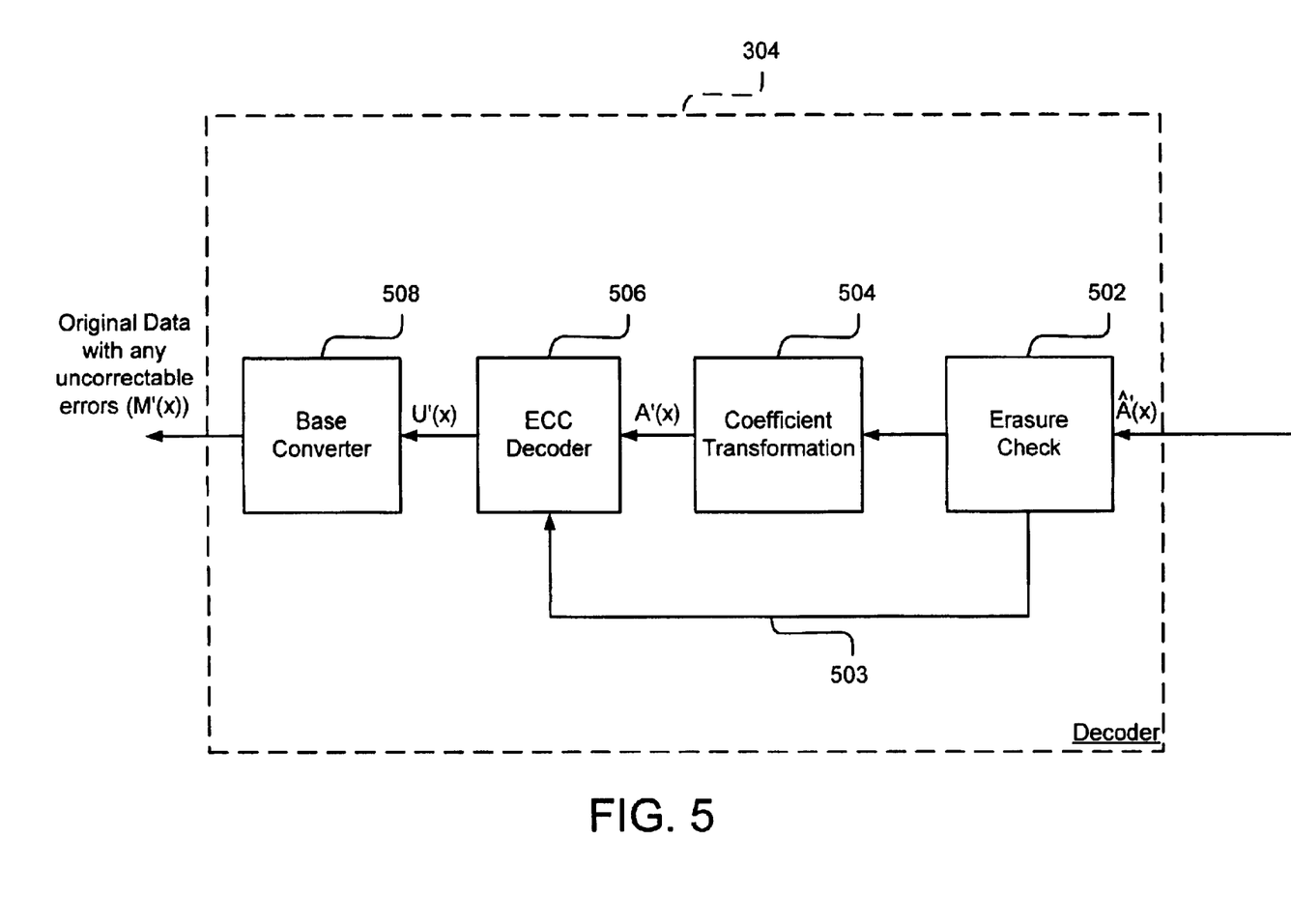
FIG. 5 is a module diagram illustrating functional modules of a decoder as in FIG. 3 in accordance with a preferred embodiment of the present invention.

The coefficient transformation module 406 outputs the transformed encoded data block, Â(x). The transformed encoded data stream Â(x) is communicated by the encoder 302 via or to a medium, such as a communications channel or a storage medium, which may impart errors into the transformed encoded data stream, Â(x). A particular embodiment of the decoder 304 is illustrated in FIG. 5 having functional modules performing decoding operations in accordance with an embodiment of the present invention. In general, the decoder 304 receives a data block, Â'(x), from a medium. It is assumed that the received data block, Â'(x), was encoded prior to being communicated via the medium, and that the medium may have created errors in the received data block. Thus, the received data block, Â'(x), may be different from the data block, Â(x), that was originally communicated via the medium. The received data block first enters an erasure-check module 502 that determines whether data in the received data block may be erased; i.e., identified or marked as incorrect.

Specifically, the erasure-check module 502 is operable to identify symbols in the received data block that have been corrupted during communication via the medium. In one embodiment, the erasure-check module 502 determines if each of the symbols in the received data block is an element of the predetermined set of values that was chosen to satisfy a modulation constraint and hence allowed by the coefficient transformation module 406 (FIG. 4). In a particular embodiment, the erasure-check module 502 determines if each of the symbols in the received data block is less than the difference between two numerical bases that are used during the encoding and decoding processes. As discussed with respect to FIG. 4, a first numerical base may be represented by $2^s$, wherein 's' is a number of bits per symbol, and the second numerical base may be represented by $p^\alpha$, wherein $p^\alpha$ is less than $2^s$. Using these two bases, the erasure-check module 502 determines whether each symbol in the received data block, Â'(x), is less than the difference value given by $(2^s-p^\alpha)$. Since in this embodiment every transmitted or stored symbol is greater than this difference value, any received or retrieved symbol that is less than this difference value is in error.

The erasure-check module 502 generates erasure information 503 that can be used to recover erased data. In one embodiment, the erasure information 503 includes locations of identified errors in the data block. As is discussed in more detail below, the erasure information 503 is transmitted to a decoder module 506. In a particular embodiment, the erasure-check module 502 sets each erroneous symbol identified in the received data blockto a predetermined value that indicates the symbol has errors.

The coefficient transformation module 504 receives the received data block including any changes made by the erasure-check module 502. The coefficient transformation module 504 transforms coefficient data in the received data block by mapping modulation coded (e.g., run-length limited) symbols to non-modulation coded symbols. The mapping function employed by the transformation module 504 is substantially the inverse of the transformation performed by the coefficient transformation module 406 (FIG. 4). In one particular embodiment, the coefficient transformation module 504 subtracts a value 'r' (shown in equation (6) above) from each symbol.

In another embodiment, the coefficient transformation module 504, maps symbols in the received data block which were selected from a set of symbols that satisfy a modulation constraint, back to symbols in the range 0 through $(p^\alpha-1)$. For example and without limitation, each of the values in the received data block from $(2^s-p^\alpha)$ through $(2^s-1)$ is mapped back to one of the values in the range 0 through $(p^\alpha-1)$. In a more particular embodiment, the coefficient transformation module 504 may perform the mapping function by subtracting from each symbol in the received data block the value $2^s-p^\alpha$. However, other embodiments may effectively utilize other mapping functions that fall within the scope of the present invention. The coefficient transformation module 504 generates a transformed data block, A'(x).

The data block, A'(x), is transmitted to an ECC decoder 506, which decodes A'(x) based on a predetermined ECC algorithm. Any $GF(p^\alpha)$-based ECC decoding algorithm may be employed by the ECC decoder 506. In a particular embodiment, the ECC decoder 506 uses a RS decoding algorithm, which can use the erasure information 503 to attempt to correct errors. The ECC decoder 506 generally utilizes the combination of the ECC parity symbols and the data symbols to identify and fix errors in the transformed data block(s), A'(x). The erasure information 503 identifies locations where errors are known to be and hence enables the ECC decoder 506 to correct a greater number of errors than would otherwise be possible. An upward base converter (or deconverter) 508 receives the output of the ECC decoder 506, and converts the base of the received data block from the second numerical base of the recorded data before transformation to its original, first numerical base.

For example, the base of U'(x) may be $p^\alpha$. In one embodiment, the upward base converter 508 converts symbols in U'(x) from base $p^\alpha$ to numerical base $2^s$, which is greater than $p^\alpha$. Thus, the output of the upward base converter 508, M'(x), includes symbols in base $2^s$, and ideally matches the data that was originally encoded prior to communication via the medium. M'(x) may not equal the original data, M(x), if uncorrectable errors arise in the data during transmission or storage.

In embodiments described herein, the logical operations of the encoder302 and the decoder 304 may be implemented as a sequence of computer implemented steps or program modules running on a microprocessor, such as, without limitation, a processor in a personal computer, computer workstation, or a disc drive (e.g., disc drive 100). It will be understood to those skilled in the art that the encoder 302 and the decoder 304 of the present invention may also be implemented as interconnected machine logic circuits or circuit modules within a computing system. The implementation is a matter of choice dependent on the performance requirements of the computing system implementing the encoder 302 and the decoder 304.

The operations, structural devices, acts, and/or modules described herein may be implemented in software, in firmware, in special purpose digital logic, and/or any combination thereof without deviating from the spirit and scope of the present invention as recited within the claims attached hereto. Furthermore, the various software routines or software modules described herein may be implemented by any means known in the art. For example, any number of computer programming languages, such as "C", "C++", Pascal, FORTRAN, assembly language, Java, etc., may be used. By way of further example, and not limitation, any scriptng language known in the art may be used, such as Korn shell script. Furthermore, various programming approaches such as procedural, object oriented or artificial intelligence techniques may be employed.

The encoder 302 and the decoder 304 may be implemented as software modules executed by a disc drive, such as the disc drive 100 illustrated in FIG. 1. As described in greater detail below, the encoder 302 may be employed to receive, store, convert, encode, and/or communicate digital data. The encoder 302 may employ microprocessor readable media for carrying out the various tasks associated with encoding data and communicating the data to be retrieved and decoded by the decoder 304. Similarly the decoder 304 may employ microprocessor readable media for carrying out the various tasks associated with decoding data and retrieving the data.

Figure 6:
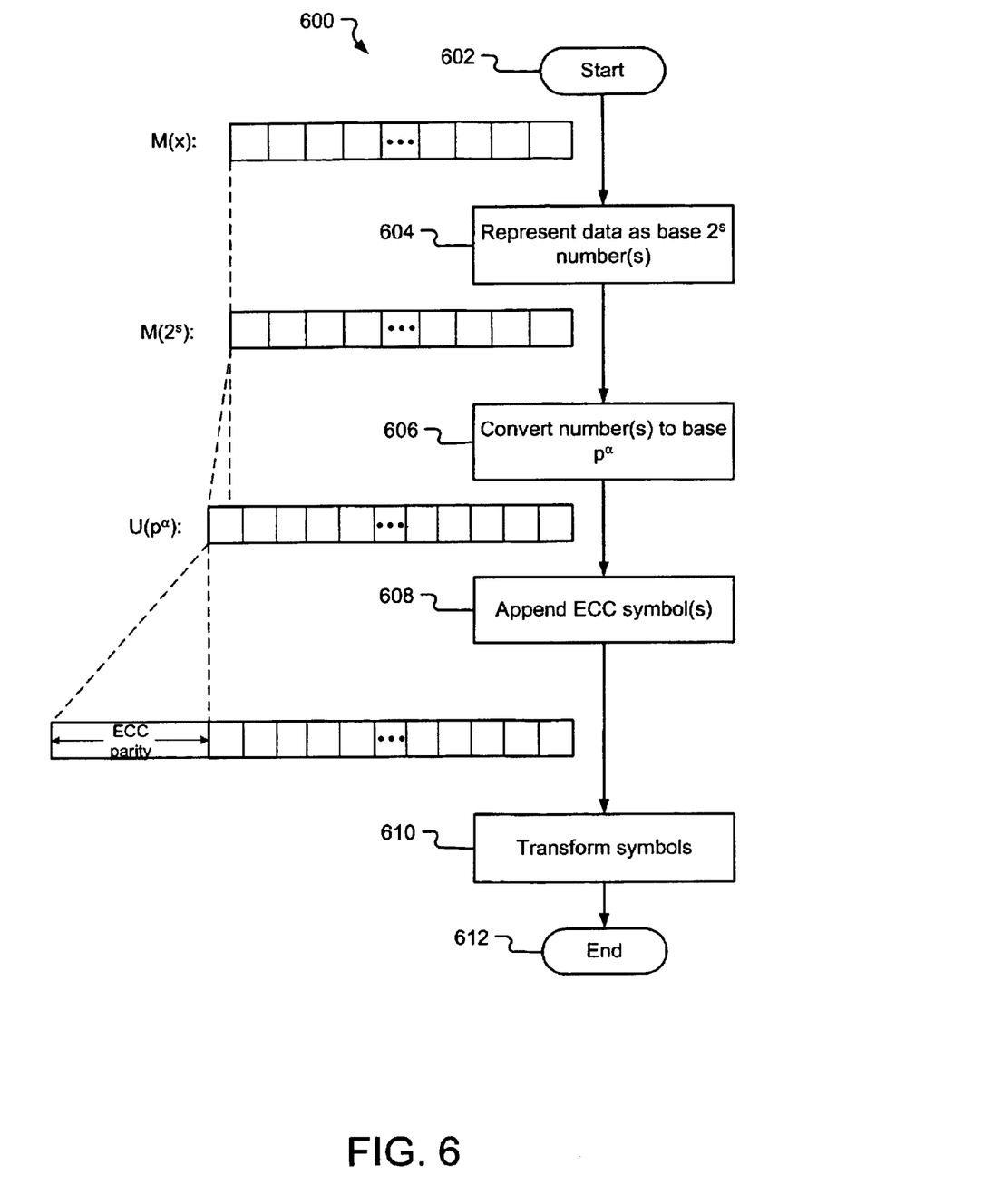
FIG. 6 is a flow control diagram illustrating exemplary operations for encoding a data block in accordance with an embodiment of the present invention.

An operation flow 600 is illustrated in FIG. 6 having operations for encoding a data block in accordance with an embodiment of the present invention. The operation flow 600 may be. executed by an encoder such as the encoder 302 illustrated in FIG. 4. Input to the operation flow 600 is a data block, such as M(x), described above. After a start operation 602, a represent operation 604 receives the data block and represents the data block as numbers in a predetermined base. In one embodiment, the represent operation 604 segments a data block into groups of bits, referred to as symbols. The manner in which bits are grouped depends on the selected numerical base. Each of the symbols is then treated as a coefficient in a polynomial of the selected base.

As illustrated in FIG. 6, in one embodiment, the represent operation 604 represents the data block as a base $2^s$ number(s). For example, suppose the first numerical base is $2^s=256$ and the input data bits are 0111001110000001 (binary). In this embodiment, M(x) is represented by segmenting the bits into groups of s=8 symbols and considering each group as a GF($2^s$)-based symbol. Each GF($2^s$)-based symbol can also be considered as a base-$2^s$ digit. Therefore, M(x)=$\mu_1 x^1$+ $\mu_0 x^0$, where the GF($2^s$) coefficients $\mu_1$=$x^6$+$x^5$+$x^4$+x+1, and $\mu_0$=$x^7$+1. Thus, the represent step 604 generates M($2^s$)= [($115_{dec}$)($129_{dec}$)]$_{256}$. A convert operation 606 then converts the base $2^s$ numbers to a second predetermined base, such as $p^\alpha$, which is less than $2^s$.

An append operation 608 determines ECC parity data associated with the data block and appends ECC parity symbols to the data block. In one embodiment, the append operation 608 computes ECC symbols using any ECC algorithm based on Galois Fields as may be known in the art, such as an RS encoding algorithm. The append operation 608 may append the ECC parity symbols anyplace in the data block, such as at either end, or throughout the data block. In an alternative embodiment, a non-systematic ECC algorithm may be employed such that the data symbols are encoded jointly with the additional parity symbols.

Figure 8:
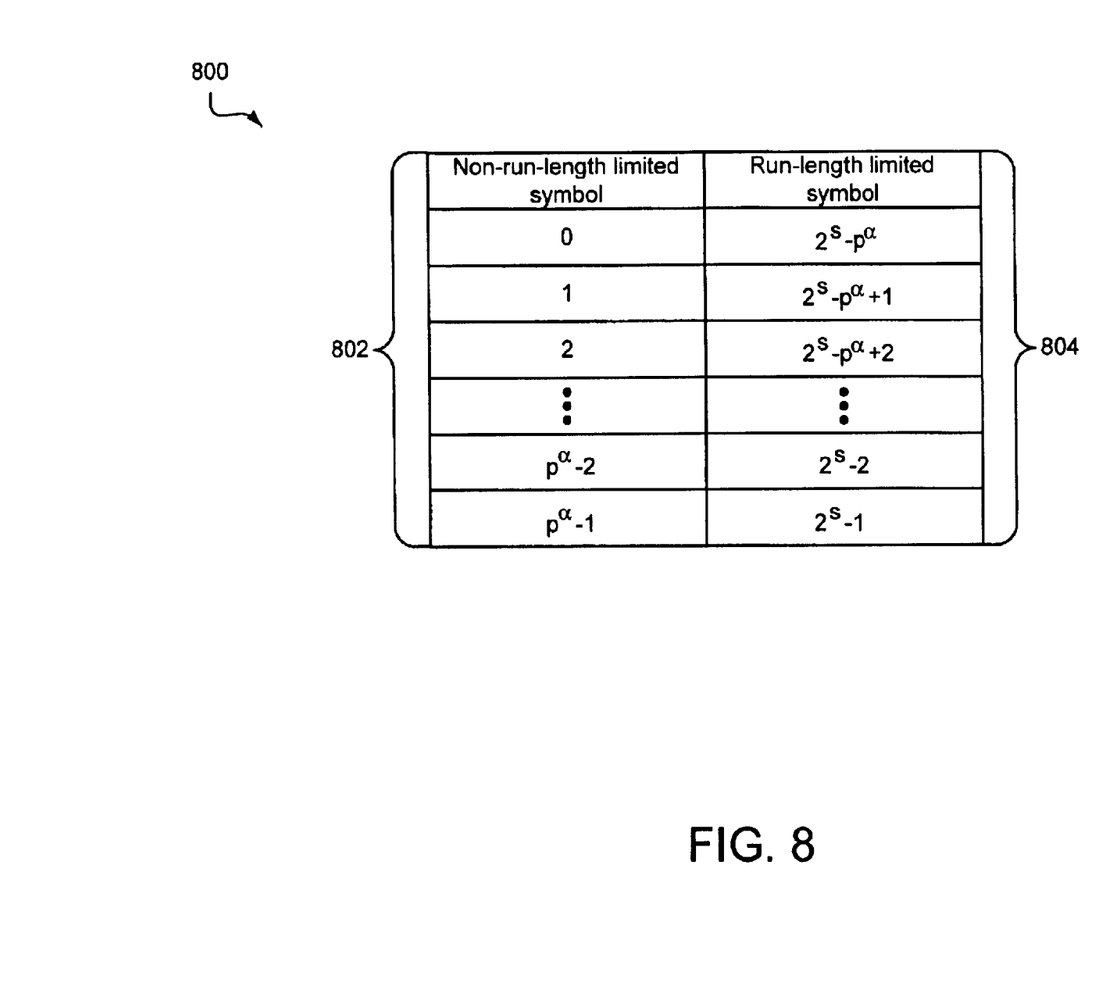
FIG. 8 is a table illustrating one scheme for mapping symbols to run-length limited symbols in accordance with an embodiment of the present invention.

A transform operation 610 maps each symbol in the data block to a unique symbol after the data block has been converted and encoded in operations 606 and 608. In one embodiment, the unique symbol is non-zero so that the resulting transformed data block has a k-constraint, a limit on the number of consecutive zeros. As has been discussed, a paricular embodiment of the transform operation 610 adds a value, 'r', to each symbol in the data block, wherein 'r' is a value in a range from 1 to ($2^s$–$p^\alpha$). FIG. 8, discussed in detail below, illustrates an embodiment of transforming, wherein addition may be used to map a symbol to a unique non-zero symbol to limit run-length. This accomplishes a range shifting transformation. Operation flow 600 ends at end operation 612.

Figure 7:
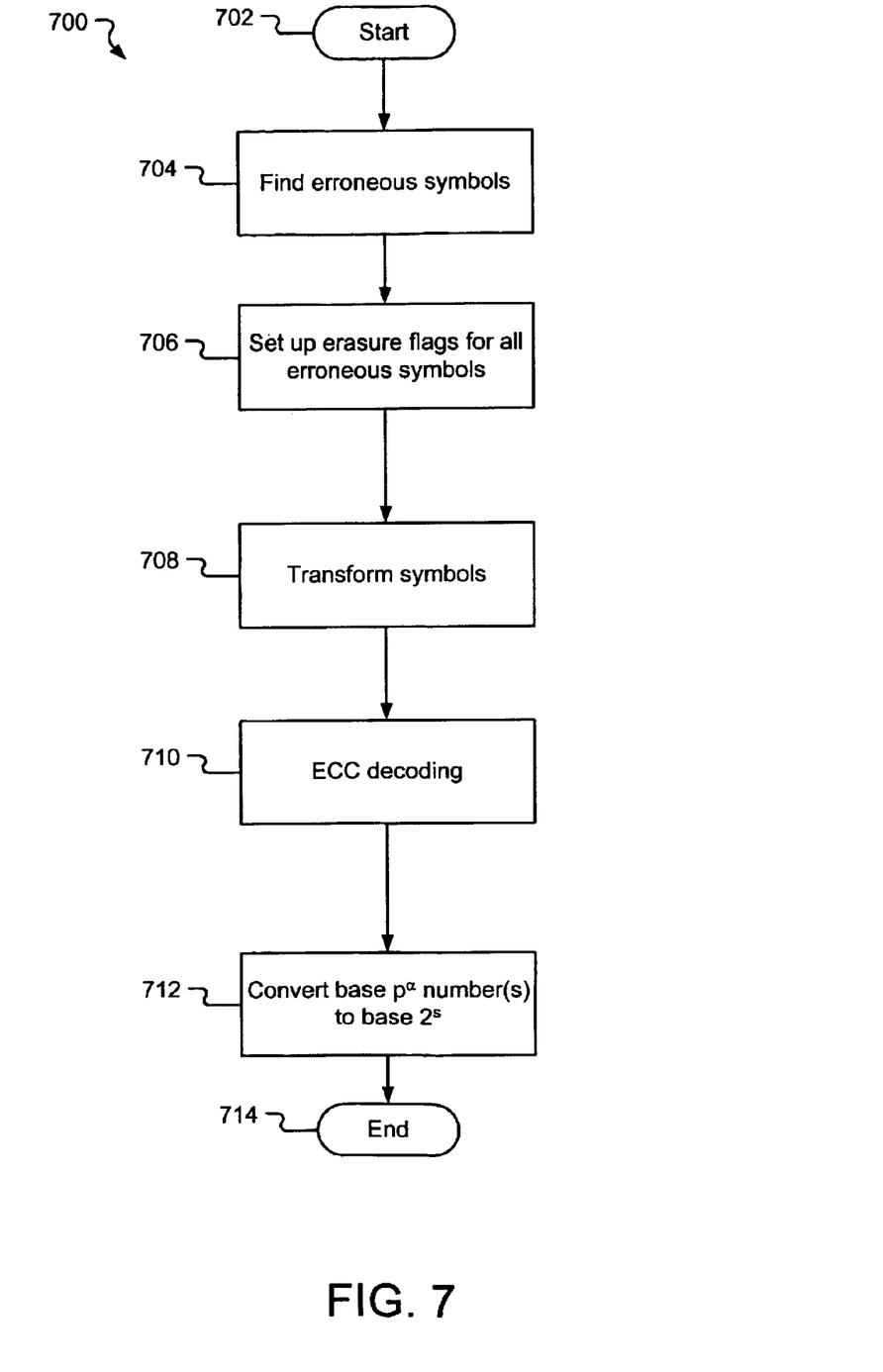
FIG. 7 is a flow control diagram illustrating exemplary operations for decoding a data block.

An operation flow 700 is illustrated in FIG. 7 having operations for decoding a data block in accordance with an embodiment of the present invention. The operation flow 700 receives a data block, such as Â'(x), and attempts to decode the received data block into originally communicated data, M(x). It is assumed in the operation flow 700 that the received data block was previously encoded using encoding operations such as those shown in FIG. 6, whereby the original data block is converted from a first base to a second base, ECC encoded, and transformed by mapping a unique value to each symbol (e.g., adding a value 'r' as in equation (6) above).

After a start operation 702, a find operation 704 identifies erroneous symbols in the received data block. The find operation 704 identifies symbols in the received data block that are not in a predetermined set of allowed symbols. In one embodiment, the find operation 704 uses a table lookup operation in which valid symbols are present in a table, and if a received symbol is not found in the table, the received symbol is identified as erroneous.

In another embodiment, the find operation 704 identifies symbols that are less than the value 'r'. As discussed earlier, the value 'r' is a value between 1 and ($2^s$–$p^\alpha$). In this embodiment, it is assumed that the transform function during encoding (e.g., see transform operation 610 in FIG. 6) included adding the value 'r' to each symbol in the data block. Thus, by identifying symbols that are less than 'r' in the find operation 704, the find operation 704 necessarily identifies symbols with errors, because no transmitted or stored symbol can be less than 'r' in this embodiment.

An initialize operation 706 sets up erasure flags for erroneous symbols identified in the find operation 704. In one embodiment, an array of erroneous symbol locations is maintained. The array can be used later in an ECC decoding operation to correct the erroneous symbols. A transform operation 708 maps each symbol in the received data block to a unique symbol in the range from 0 to $p_\alpha$-1, wherein $p^\alpha$ is the second numerical base following encoding. In one embodiment, the transform operation subtracts the value 'r' from each symbol in the received data block, wherein 'r' is a value in the range {1, $2^s$–$p^\alpha$}. A decode operation 710 decodes the data block based on the ECC algorithm used prior to communicating the data via the medium. The decode operation 710 may employ any decoding operation known in the art wherein the GF-based ECC encoding is used. After the received data block is transformed and decoded, a convert operation 712 converts the received data block from the second base back into the first base. As illustrated in FIG. 7, the convert operation 712 converts from a base, $p^\alpha$ to a base $2^s$. The operation 700 ends at end operation 714.

A table 800 is shown in FIG. 8 illustrating a transform operation or mapping from one set of symbols to another set of symbols in accordance with an embodiment of the present invention. The particular values in the table 800 are selected to meet a specified k-constraint. However, it is to be understood that other values may be used to achieve other modulation constraints, and other mappings may provide more stringent k-constraints. The values in the table 800 assume an 'r' value of ($2^s$–$p^\alpha$), discussed above, for transforming symbols that are not run-length limited to symbols that are run-length limited. As illustrated in the particular embodiment, the left column of the table 800 is a set of non-run-length limited symbols 802. The non-run-length limited symbols 802 range from 0 to $p^\alpha$–1. To ensure that the non-run-length limited symbols do not include more than a maximum number of consecutive 0s, the non-run-length limited symbols are mapped, during encoding, to run-length-limited symbols 804; i.e., mapped to symbols, all of which contain at least one '1'.

As illustrated, the run-length-limited symbols 804 encompass a range from a lower limit of ($2^s$–$p^\alpha$) to an upper limit of ($2^s$–1). As discussed earlier, the value $2^s$ is the numerical base of the original data prior to encoding, and the value $p^\alpha$ is the second numerical base after encoding. Thus, the exemplary Table 800 illustrates mapping from a set of values represented in a second base to a range of values wherein the range is determined by a function of the first base and the second base. By way of example, and not limitation, if $2^s$=16 and $p^\alpha$=9, a range of non-zero transformed symbols for 'r' of 7 is shown in Table 1:

TABLE 1

| non-run-length limited symbol | run-length limited symbol in decimal | run-length limited symbol in binary |
| --- | --- | --- |
| 0 | 7 | 0111 |
| 1 | 8 | 1000 |
| 2 | 9 | 1001 |
| 3 | 10 | 1010 |
| 4 | 11 | 1011 |
| 5 | 12 | 1100 |
| 6 | 13 | 1101 |
| 7 | 14 | 1110 |
| 8 | 15 | 1111 |

It will be appreciated that all of the run-length limited values in the third column of Table 1 include at least one binary '1'. In another embodiment, the non-run-length limited symbols in the first column may be mapped to other unique values in the range {1, $2^s$–1}, and the mapping need not be based on addition as shown in FIG. 8 and the example in Table 1.

Although the mapping indicated in FIG. 8 and Table 1 are particularly relevant to achieve a particular k-constraint, other mappings can be selected that are suitable to achieve other modulation constraints that are relevant to a particular implementation.

Figure 9:
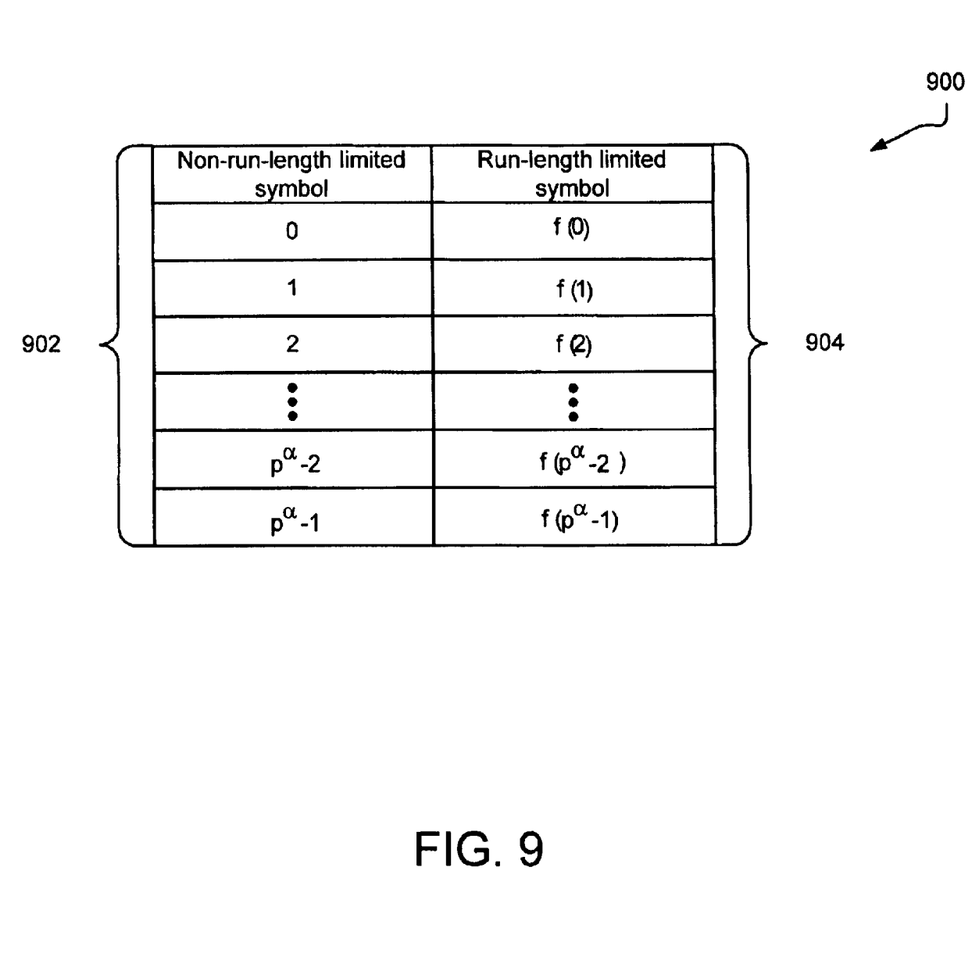
FIG. 9 is a table illustrating another exemplary scheme for mapping symbols to transformed symbols in accordance with an embodiment of the present invention.

An alternative embodiment of the transformation process involves a mapping that prevents symbols with large numbers of zeros from occurring in Â(x). This embodiment may be particularly useful where binary ones provide timing information. Such a transformation may eliminate the symbols "000 . . . 000" (the ellipsis represents some number of zeros that makes the string of ones and zeros of a length equal to the symbol size), "000 . . . 001", "100 . . . 000", "000 . . . 010", "0100 . . . 000", "000 . . . 0100", "00100 . . . 000", etc. By eliminating symbols in this order, adjacent pairs of symbols are less able to create long runs of zeros in the transformed output block.

FIG. 9 illustrates a table 900 for mapping original symbol values 902 to transformed symbol values 904, which are a function of the original symbol values. For a k-constraint the transformed symbol values 904 are bounded by the range $\{1, 2^s-1\}$, where $2^s$ is the initial numerical base of the data block to be encoded. FIG. 9 illustrates a more generalized mapping that will allow one skilled in the art to transform an ECC-encoded data block using base conversion in accordance with embodiments of the present invention.

For purposes of illustration only, two examples of base-converting and coefficient transforming in accordance with one embodiment are shown below. While the example illustrates particular values and symbols, it is to be understood that embodiments of the present invention are not confined to any particular values, and may perform operations on any values supported by the particular hardware (e.g., microprocessor) used in the embodiment.

In the example, the input data block, M(x), is represented in base $2^4$, or 16. As is known by those skilled in the art, base 16 is commonly referred to as 'Hexadecimal,' or 'Hex.' In bases that are greater than base 10, such as Hex, digits that are greater than 9 are represented by capital English letters, starting with A. Thus, available Hex digits range from 0 through 9, and A through F, where A through F represent values 10 through 15, respectively in base 10. Two second-base representations ($p^\alpha$) will be illustrated in the examples: one representation in base 13, and one in base $3^2=9$.

In the example, M(x) is $18084_{16}$, as shown by equations (8) and (9) below:

$$M_{16}(x)=1x^4+8x^3+0x^2+8x^1+4 \quad (8)$$

$$M_{16}=18084_{16} \quad (9)$$

The following equations (10) and (11) illustrate how $M_{16}(x)$ is represented by U(x) in bases 13 and 9, respectively:

$$U_{13}(x)=0x^5+3x^4+5x^3+Ax^2+6x^1+0 \quad (10)$$

$$U_9(x)=1x^5+6x^4+0x^3+2x^2+2x^1+3 \quad (11)$$

Continuing with the illustrative example, an RS block can have no more than $p^\alpha-1$ symbols in the block including the ECC parity symbols. The symbol size thus controls the block size. The symbol size is chosen to fit the coded blocks both with $GF(2^s)$ coefficients and with $GF(p^\alpha)$ coefficients. To illustrate the advantages provided in embodiments of the present invention, the example will illustrate differences between ECC encoding the input data block M(x) in the initial base (16) as compared to ECC encoding the input block M(x) as it is represented in the two bases 13 and 9 (i.e., $U_{13}(x)$ and $U_9(x)$).

Assume in the example that parity symbols have been calculated for a single-error correcting RS ECC. In base 16, the initial base of M(x), the parity symbols are, for illustrative purposes only, assumed to be 0 and A. These values are used only to illustrate the concept to one skilled in the art. Thus, the following equations (12)-(14) illustrate exemplary ECC encoded representations of $M_{16}(x)$, $U_{13}(x)$, and $U_9(x)$, respectively.

$$B_{16}(x)=1x^6+8x^5+0x^4+8x^3+4x^2+0x^1+A \quad (12)$$

$$A_{13}(x)=0x^7+3x^6+5x^5+Ax^4+6x^3+0x^2+0x^1+1 \quad (13)$$

$$A_9(x)=1x^7+6x^6+0x^5+0x^4+2x^3+3x^2+8x^1+7, \quad (14)$$

where $B_{16}(x)$ is the ECC encoded representation of $M_{16}x)$ from equations (8) and (9), $A_{13}(x)$ is the ECC encoded representation of $U_{13}(x)$ from equation (10), and $A_9(x)$ is the ECC encoded representation of $U_9(x)$ from equation (11).

Continuing with the illustrative example, a coefficient transformation process is illustrated, where the first base equals 16 and the second bases equal 13 and 9. For second base 13, an associated 'r' value is selected from the range bounded by 1 and 16−13=3. For second base 9, 'r' is selected from the range bounded by 1 and 16−9=7. For this particular example, assume r=3 for the conversion to base 13 and r=7 for the conversion to base 9. The exemplary coefficient transformation is illustrated in equations (15) and (16), wherein 'r' has been added to each of the coefficients of the corresponding data block A(x).

$$Â_{13}(x)=3x^7+6x^6+8x +Dx^4+9x^3+3x^2+3x^1+4 \quad (15)$$

$$Â_9(x)=8x^7+Dx^6+7x^5+7x^4+9x^3+Ax^2+Fx^1+E \quad (16)$$

It will be appreciated that the coefficients of $Â_{13}(x)$ range from 3 to F (15 in base 10), whereas the coefficients of $A_{13}(x)$ range from 0 to C (12 in base 10). Similarly, the coefficients of $Â_9(x)$ range from 7 through F, whereas the coefficients of $A_9(x)$ range from 0 through 8. To further illustrate advantages of embodiments of the present invention, it is useful to represent the data blocks $B_{16}(x)$, $Â_{13}(x)$, and $Â_9(x)$ in binary form as shown in equations (17)–(19):

$$B_{16}(x)=0001\ 1000\ 0000\ 1000\ 0100\ 0000\ 1010 \quad (17)$$

$$Â_{13}(x)=0011\ 0110\ 1000\ 1101\ 1010\ 0011\ 0011\ 0100 \quad (18)$$

$$Â_9(x)=1000\ 1101\ 0111\ 0111\ 1001\ 1010\ 1111\ 1110 \quad (19)$$

When illustrated in binary form, it is readily recognized that $B_{16}(x)$ includes zero run-lengths of 7 and 6, whereas the maximum zero run-lengths of $Â_{13}(x)$ and $Â_9(x)$ are both 3. Using embodiments of the encoder 302 (FIG. 3), the worst case (i.e., largest) or maximal run-length occurs when r=1 and two adjacent symbols in the ECC encoded data block are 1 followed by a quantity of s-1 zeros and s-1 zeros followed by a 1, where 's' is the number of bits/symbol. Furthermore, it will be appreciated that as 'r' increases, the k-constraint decreases, thereby improving the timing characteristics of the data sequence. When r=1, the k-constraint may be computed as follows: k=2s−2. It can be shown that the maximum code rate that results due to numerical base-conversion is given by equation (20):

$$CodeRate = \left\lceil \frac{\log_2(p^\alpha)}{\log_2(2^s)} \right\rceil = \frac{\alpha}{s} \log_2 p. \qquad (20)$$

Advantageously, when 'r' is added to symbols in an ECC encoded data block prior to communication via a medium, such as a data storage disc, some errors in symbols can be readily identified after retrieval from the medium, by identifying any symbols that are less than 'r'. Additionally, and unlike traditional RLL approaches, errors in run-length limiting data do not propagate beyond the symbol in which the errors occur; i.e., errors are confined tothe symbol in which they reside by virtue of the fact that the transformation is memoryless, transforming only one symbol at a time with no dependence upon previous or future symbols.

The logical operations of the various embodiments of the present invention are implemented (1) as a sequence of computer implemented acts or program modules running on a computing system, such as the disc drive 100 (FIG. 1), and/or (2) as interconnected machine logic circuits or circuit modules within the computing system. The implementation is a matter of choice dependent on the performance requirements of the computing system implementing the invention. Accordingly, the logical operations making up the embodiments of the present invention described herein are referred to variously as operations, structural devices, acts or modules. It will be recognized by one skilled in the art that these operations, structural devices, acts and modules may be implemented in software, in firmware, in special purpose digital logic, and any combination thereof without deviating from the spirit and scope of the present invention as recited within the claims attached hereto.

In summary, an embodiment of the present invention may be viewed as a method of communicating data by representing (such as 604) data in a first base representation, converting (such as 606) the representation of the data in the first base to a representation of the data in a second base, error correction encoding (such as 608) the representation of data in the second base, and transforming (such as 610) coefficients of the error correction encoded representation of the data in the second base to provide a desired property or properties that are particularly useful or necessary for transmission or storage through a communication or data storage channel, for example and without limitation, to limit the maximum number of consecutive zeroes in the encoded representation.

Another embodiment may be viewed as a system (such as 100) for communicating data having an encoder (such as 302) with a base converter module (such as 402) that receives input data and converts the input data from a first base to a second base, wherein the second base is less than the first base, a communicating module (such as 118) operable to communicate the second base-converted data to a medium (such as 306, 108), a retrieving module (such as 118) operable to retrieve the second base-converted data from the medium, and a decoder (such as 304) having a base deconverter module (such as 508) operable to convert the retrieved second base-converted data from the second base to the first base. The system may further include an error correction code (ECC) encoding module (such as 404) operable to perform ECC encoding operations on the input data, and a coefficient transformation module (such as 406) operable to map symbols in the input data to symbols in a set defined to achieve a predetermined modulation constraint.

It will be clear that the present invention is well adapted to attain the ends and advantages mentioned as well as those inherent therein. While a presently preferred embodiment has been described for purposes of this disclosure, various changes and modifications may be made which are well within the scope of the present invention. The present invention may be implemented in any storage or communication device that employs an error-control coding algorithm based on Galois Fields. For example, the present invention may be implemented in a magnetic tape storage device. The encoder of the present invention may be adapted to dynamically select the numerical bases that are used in encoding and insert base information into the communicated data that allows the decoder to dynamically identify the selected bases and decode accordingly. Numerous other changes may be made which will readily suggest themselves to those skilled in the art and which are encompassed in the spirit of the invention disclosed and as defined in the appended claims.

What is claimed is:

1. A method of communicating data comprising steps of:
   (a) representing data in a first base representation;
   (b) converting the representation of the data in the first base to a representation of the data in a second base;
   (c) error correction encoding the representation of data in the second base; and
   (d) transforming coefficients of the error correction encoded representation of the data in the second base to obtain transformed encoded data meeting a specified constraint.

2. The method of claim 1 further comprising a step of:
   (e) communicating the transformed encoded data via a medium.

3. The method of claim 2 wherein the medium is a data storage disc in a disc drive.

4. The method of claim 2 wherein the medium is a data storage tape in a tape drive.

5. The method of claim 2 wherein the medium is a transmission channel.

6. The method of claim 2 wherein the medium is an Internet.

7. The method of claim 2 further comprising steps of:
   (f) retrieving the transformed encoded representation of the data from the medium, wherein the transformed encoded data as retrieved may be different from the transformed encoded data as communicated due to a disturbance in the medium.

8. The method of claim 7 further comprising steps of:
   (g) transforming coefficients of the retrieved transformed encoded representation to obtain encoded data;
   (h) error correction decoding the encoded data to obtain data represented in the second base; and
   (i) converting the data represented in the second base to data represented in the first base.

9. The method of claim 8 wherein the second base is less than the first base and wherein the transforming step (g) comprises a step of:
   (g)(i) subtracting the difference between the first base and the second base from the coefficients of the transformed encoded data.

10. The method of claim 8 further comprising steps of:
    (j) performing an erasure-check upon the transformed encoded data to identify erasure data for the retrieved data; and
    (k) correcting the retrieved data according to the erasure data.

11. The method of claim 10 wherein the performing step (j) comprises steps of:
    (j)(i) identifying that one or more errors has occurred; and
    (j)(ii) identifying the location of each identified error in the retrieved representation.

12. The method of claim 1 wherein the second base is less than the first base.

13. The method of claim 12 wherein the transforming step (d) comprises a step of:
 (d)(i) mapping coefficients in the error correction encoded representation of the data in the second base to a symbol from a range of values defined by a function of the first and second bases.

14. The method of claim 13 wherein the range in the mapping step (d)(i) comprises:
 a lower limit defined by the difference between the first base and the second base; and
 an upper limit defined by the first base minus 1.

15. The method of claim 12 wherein transforming step (d) comprises a step of:
 (d)(i) adding the difference between the first base and the second base to coefficients of the error correction encoded data.

16. The method of claim 1 wherein the data in the first base representation comprises coefficients in a first range, and wherein the transforming step (d) comprises a step of:
 (d)(i) shifting the first range of the coefficients such that the transformed encoded data has a k-constraint that is a function of the first base and the second base.

17. The method of claim 1 wherein the transforming step (d) comprises a step of:
 (d)(i) mapping each of the coefficients of the error correction encoded representation to a unique coefficient to ensure a predetermined k-constraint in the transformed encoded data.

18. A method of decoding data retrieved from a medium comprising steps of:
 (a) error correction decoding the retrieved data; and
 (b) converting symbols represented in a first base in the retrieved data to symbols represented in a second base.

19. The method of claim 18 further comprising steps of:
 (c) transforming the retrieved data prior to error correction decoding.

20. The method of claim 19 wherein the first base is less than the second base and wherein the transforming step (c) comprises subtracting the difference between the first base and the second base from symbols in the retrieved data.

21. The method of claim 19 further comprising steps of:
 (d) identifying erroneous symbols in the retrieved data, wherein the erroneous symbols are not among a set of allowed symbols.

22. The method of claim 21 further comprising steps of:
 (e) initializing erasure information associated with the erroneous symbols, wherein the erasure information includes error location information used for error correction decoding.

23. The method of claim 22 wherein the first base is less than the second base and wherein the identifying steps (d) of identifying erroneous symbols comprises steps of:
 (d)(i) identifying symbols having a value less than the difference between the first base and the second base.

24. The method of claim 18 wherein the first base is less than the second base.

25. A system for communicating data comprising: an encoder having a base converter module that converts input data from a first base to a second base and an error correction code encoding module that performs ECC encoding operations on the converted input data to create error correction encoded input data; and
 a communicating module that communicates the error correction encoded input data to a medium.

26. The system of claim 25 wherein the encoder further comprises:
 a first coefficient transformation module that maps symbols in the error correction encoded input data to a range of symbols chosen to meet a predetermined constraint.

27. The system of claim 26 wherein the second base is less than the first base and wherein the first coefficient transformation module further adds a value 'r' to each of the symbols in the error correction encoded input data, wherein the value 'r' is equal to $(2^s - p^a)$, 's' is a number of bits per symbol in the input data, $2^s$ is the first base, and $p^a$ is the second base.

28. The system of claim 27, further comprising:
 a retrieving module that retrieves the encoded data from the medium; and
 a decoder having a base deconverter module that converts the retrieved encoded data from the second base to the first base.

29. The system of claim 28 wherein the decoder further comprises:
 an erasure-check module that identifies symbols in the retrieved data in which an error has occurred.

30. The system of claim 28 wherein the second base is less than the first base and wherein the decoder further comprises a second coefficient transformation module that subtracts the value 'r' from each symbol in the retrieved data.

31. The system of claim 25 wherein the second base is less than the first base.

32. A disc drive comprising:
 a communication module that writes encoded data to a disc in the disc drive; and
 means for converting unencoded data in a first numerical base to error correction coded encoded data in a second numerical base, wherein the unencoded data and the error correction coded encoded data each comprise a plurality of symbols.

33. The disc drive of claim 32 wherein the means for converting comprises:
 a base converter module that converts the unencoded data in the first base into transformed data in the second base;
 an error-correction code module that encodes the transformed data in the second base with error correction code (ECC) parity data to derive the ECC encoded data; and
 a coefficient transformation module that maps each symbol in the ECC encoded data to a unique symbol chosen from a predetermined set of symbols.

34. The disc drive of claim 33 wherein the second numerical base is less than the first numerical base and the base converter module comprises a downward base converter module.

35. The disc drive of claim 33 further comprising:
 an erasure-check module that receives the encoded data from the disc as it may have been modified and identify one or more erroneous symbols in the encoded data;
 an error-correction decode module that decodes the ECC encoded data represented in the second base; and
 an upward base converter in operable communication with the erasure-check module that converts ECC encoded data in the second base into encoded data in the first base.

\* \* \* \* \*